(12) United States Patent
Joo

(10) Patent No.: US 7,558,115 B2
(45) Date of Patent: Jul. 7, 2009

(54) PROGRAM METHOD OF FLASH MEMORY DEVICE

(75) Inventor: Seok Jin Joo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 568 days.

(21) Appl. No.: 11/479,575

(22) Filed: Jun. 30, 2006

(65) Prior Publication Data

US 2007/0081388 A1    Apr. 12, 2007

(30) Foreign Application Priority Data

Oct. 10, 2005    (KR) .................. 10-2005-0094930

(51) Int. Cl.
G11C 11/34    (2006.01)
(52) U.S. Cl. .................. 365/185.18; 365/185.19; 365/185.22
(58) Field of Classification Search ............ 365/185.18, 365/185.19, 185.22
See application file for complete search history.

(56) References Cited

U.S. PATENT DOCUMENTS 6,385,112 B1 *   5/2002   Kurosaki ............... 365/185.33
6,434,051 B1 *   8/2002   Endo .................... 365/185.21
6,789,697 B2 *   9/2004   Neess .................... 221/305

FOREIGN PATENT DOCUMENTS

| JP | 2005-032431 A | 2/2005 |
|---|---|---|
| KR | 10-0296331 B1 | 5/2001 |
| KR | 10-2001-0065151 A | 7/2001 |
| KR | 10-2006-0107689 A | 10/2006 |
| KR | 10-2006-0122590 A | 11/2006 |
| WO | WO 2005/010638 A2 | 2/2005 |

* cited by examiner

*Primary Examiner*—Son Dinh
(74) *Attorney, Agent, or Firm*—Townsend and Townsend and Crew LLP

(57) ABSTRACT

A method for programming a non-volatile memory device includes applying a first dummy voltage to a Multi-Level Cell (MLC). A first program voltage is applied to the MLC to program the MLC, the first program voltage being applied to the MLC after the first dummy voltage has been applied to the MLC. The MLC is verified whether or not the MLC has been programmed correctly by the first program voltage. A second dummy voltage is applied to the MLC after the first dummy voltage has been applied, the second dummy voltage being N volt higher than the first dummy voltage, wherein the second dummy voltage applied to the MLC is of sufficiently low voltage, so that the second dummy voltage does not change an initial state of the MLC. A third dummy voltage is applied to the MLC after the second dummy voltage has been applied, the third dummy voltage being N volt higher than the second dummy voltage.

16 Claims, 4 Drawing Sheets

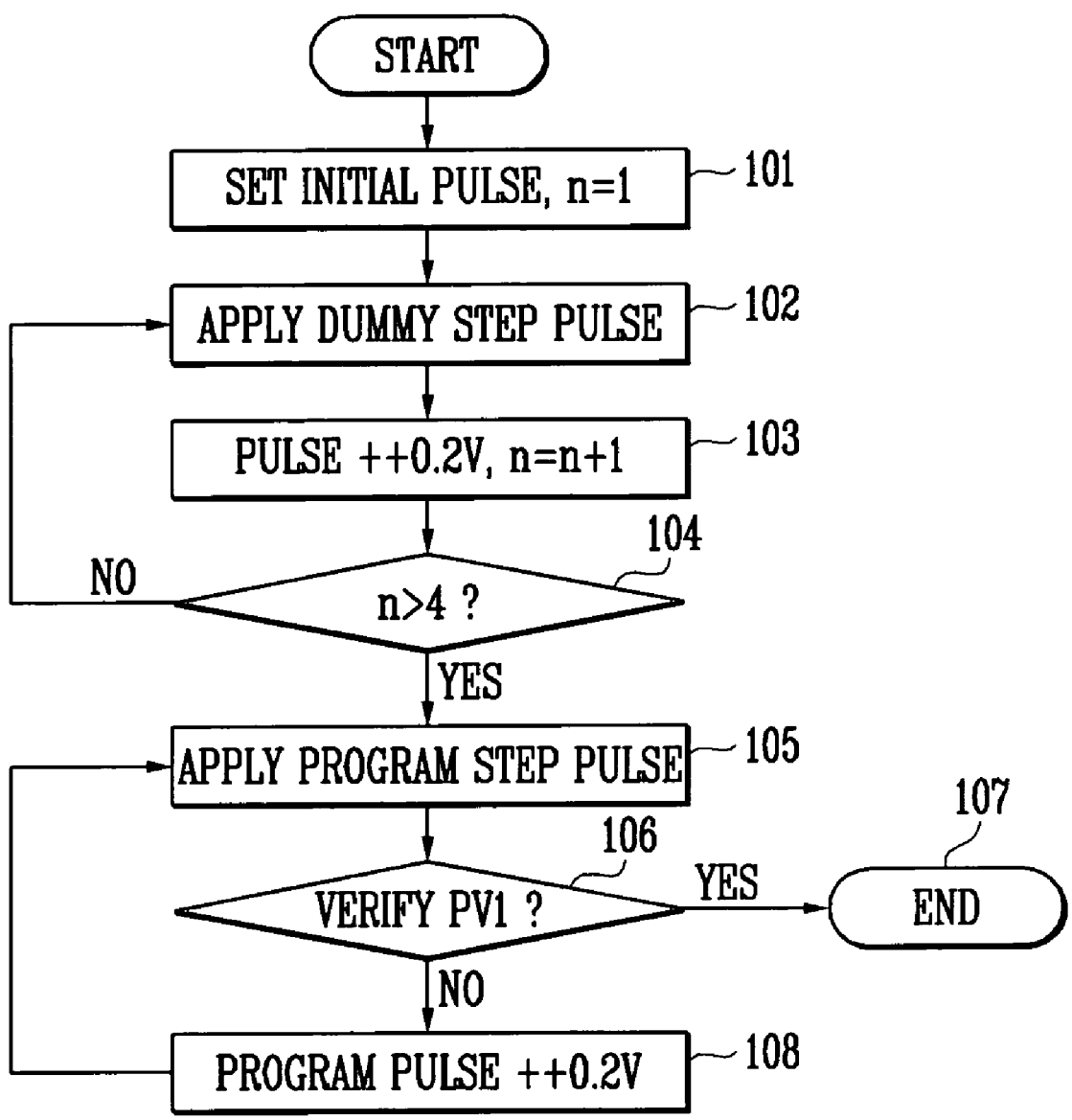

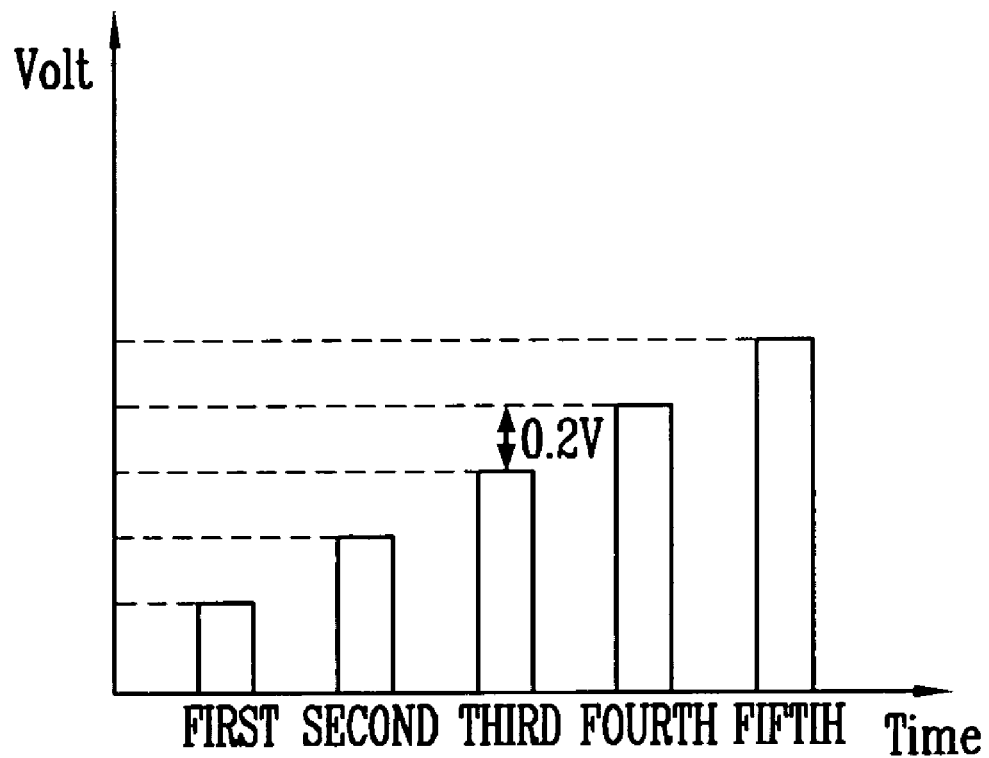

PROGRAM METHOD OF FLASH MEMORY DEVICE

BACKGROUND

The present invention relates to a flash memory device, and more particularly, to a program method which can reduce the threshold voltage distribution width of a flash memory device having a multi-level cell.

Currently, there is an increasing demand for semiconductor memory devices which can be electrically programmed and erased and does not require refreshing the data. Furthermore, to develop large capacity memory devices, there has been research done to increase the level of integration. Accordingly, there has been much research done into flash memories.

Flash memory is generally classified as NAND flash memory or NOR flash memory. The NOR flash memory has a structure in which memory cells are independently connected to bit lines and word lines. Its main advantage is a faster random access time. Meanwhile, the NAND flash memory has a structure in which a plurality of memory cells are connected in series and only one contact per cell string is required. Its advantage is the higher level of integration. Accordingly, the NAND type structure is generally used in high-integration flash memories.

In recent years, to further increase the degree of integration of flash memory, research has been done into storing more than one bit in one memory cell. This type of a memory cell is generally referred to as a "Multi-Level Cell (MLC)". A memory cell of a single bit corresponding to the MLC is referred to as a "Single Level Cell (SLC)".

In general, the threshold voltages (Vt) of the MLCs may be set to various states depending on the data being stored. In more detail, since 2-bit data can be programmed into the MLC, one MLC can store any one of four values (i.e., 1, 10, 01, and 00) with each binary value being assigned a threshold voltage (Vt) state.

The program methods of a MLC can be largely classified into two kinds. The first method performs three program operations using different program voltages at each time of the one-page program in order to implement four threshold voltage levels. In this case, the program time is three times greater than that of a SLC having the same capacity. Furthermore, since the voltage gap between the four threshold voltages is very narrow (0.7 to 0.8V), an Incremental Step Pulse Program (ISPP) voltage must be set to range from 0.15 to 0.2V during the program operation. This means that the ISPP voltage must be reduced in comparison with the SLC (about 0.5V). Therefore, the overall program time is 7 to 9 times greater than that of the SLC.

To solve the problem, a program method of allocating different row addresses to 2 bits programmed into one cell has been proposed. As shown in FIG. 1, upon first program, Least Significant Bit (LSB) data ("11"→"10") of the 2 bits are programmed. Thereafter, upon second program, Most Significant Bit (MSB) data ("11"→"01" or "10"→"00") are programmed. At this time, it is determined whether a current cell is "11" or "01" by reading a first page and different voltages are then applied to the bit lines.

If threshold voltage distributions of programmed cells of the MLC are increased, the gap between threshold voltages of each program state is further narrowed. This has a negative effect on the reliability of cell operation. It is therefore necessary to reduce the threshold voltage distributions of the cell. In general, the easiest method to reduce the threshold voltage distributions of ISPP is to lower the ISPP voltage. If the ISPP voltage is lowered, the required pulse number is increased. Accordingly, a problem arises because the program time is lengthened.

SUMMARY OF THE INVENTION

An embodiment of the present invention provides a program method of a flash memory device, in which the threshold voltage distribution can be reduced by applying a dummy pulse to a MLC having a state "10" at which a threshold voltage width is wide before the ISPP program operation.

According to an aspect of the present invention, a program method of a flash memory device is provided, including the steps of; repeatedly applying an increasing dummy step pulse to the extent that an initial state of a MLC is not changed; programming the MLC by applying a program step pulse to the MLC; performing a verify operation to verify the program state of the MLC; and if the MLC has been normally programmed, finishing the program operation, and if the MLC has not been normally programmed, raising the program voltage to a predetermined level and then returning to the program operation.

According to one embodiment, a method for programming a non-volatile memory device includes applying a first dummy voltage to a Multi-Level Cell (MLC). A first program voltage is applied to the MLC to program the MLC, the first program voltage being applied to the MLC after the first dummy voltage has been applied to the MLC. The MLC is verified whether or not the MLC has been programmed correctly by the first program voltage. A second dummy voltage is applied to the MLC after the first dummy voltage has been applied, the second dummy voltage being N volt higher than the first dummy voltage, wherein the second dummy voltage applied to the MLC is of sufficiently low voltage, so that the second dummy voltage does not change an initial state of the MLC. A third dummy voltage is applied to the MLC after the second dummy voltage has been applied, the third dummy voltage being N volt higher than the second dummy voltage.

In yet another embodiment, a predetermined number of dummy voltages are applied to the MLC prior to applying the first program voltage to the MLC. The method further comprises applying a second program voltage to the MLC if the MLC is determined not to have been programmed correctly, the second program voltage being higher than the first program voltage by N volt. The first and second program voltages are applied to the MLC after all the dummy voltages have been applied to the MLC. In one implementation, N is more than 0.4, or 0.3, or 0.2.

BRIEF DESCRIPTION OF THE DRAWINGS

FIG. 4 is a flowchart illustrating a LSB program operation of the flash memory device according to an embodiment of the present invention; and FIG. 5 shows a waveform of ISSP voltages.

DETAILED DESCRIPTION OF EMBODIMENTS

Figure 1:
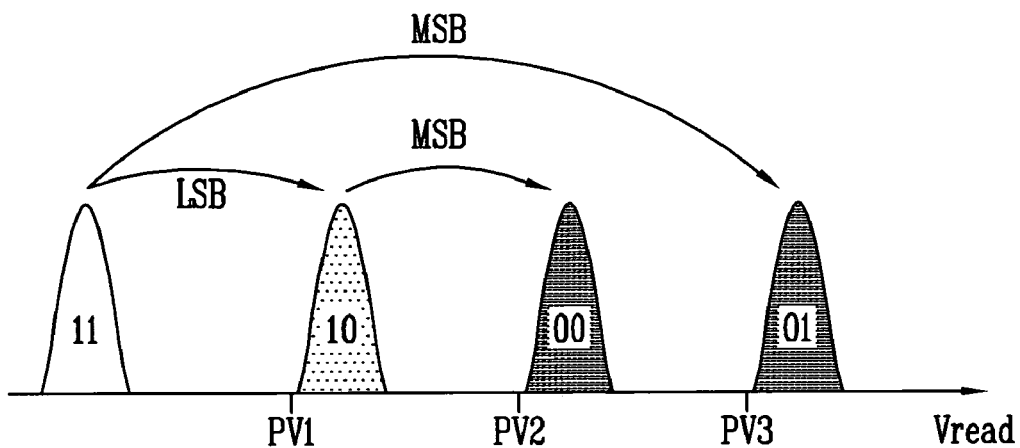
FIG. 1 is a view illustrating threshold voltage distributions depending on the program states of a flash memory device having a MLC.

The present invention will be described in detail in connection with certain embodiments with reference to the accompanying drawings. To clarify multiple layers and regions, the thickness of the layers is enlarged in the drawings.

Figure 2:
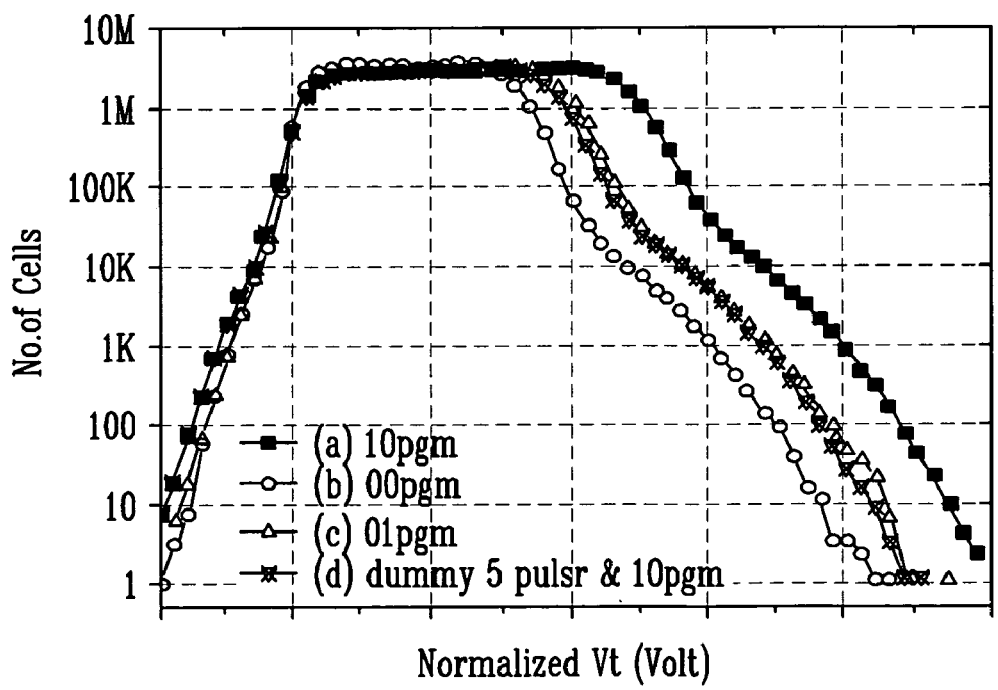
FIG. 2 is a graph illustrating threshold voltage distributions depending on the program states "10", "00", and "01" when the same ISSP voltage is applied.

FIG. 2 is a graph in which respective program verify operations are moved to 0V in order to relatively compare the threshold voltage distributions with the program states "10", "00", and "01". From FIG. 2, it can be seen that the threshold voltage distribution (b) of "00" is the narrowest and the threshold voltage distribution (a) of "10" is the widest.

Figure 3:
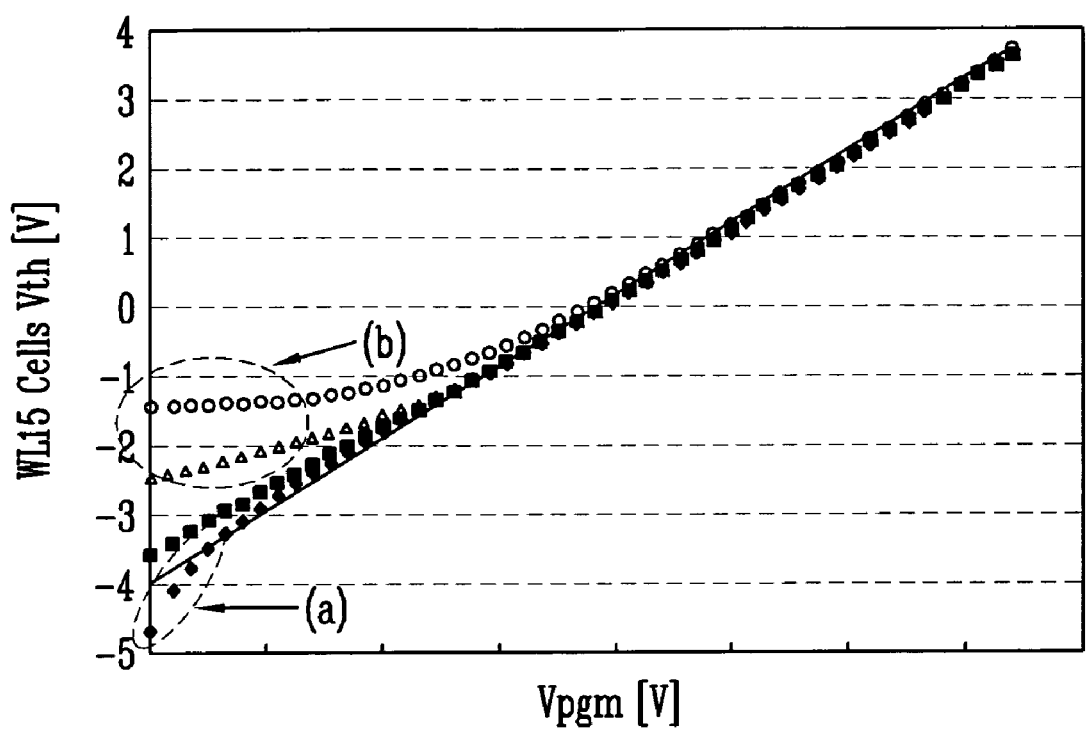
FIG. 3 is a graph illustrating the relationship between an ISPP program start voltage, an initial threshold voltage of a cell, and a threshold voltage of a cell by the ISPP program operation according to an embodiment of the present invention.

From FIG. 3, it can be seen that after the ISPP program operation is sufficiently performed, a constant threshold voltage is obtained regardless of an initial threshold voltage value of a cell, but while an initial ISPP program operation is carried out, variation in the threshold voltage by ISPP is different depending on the initial threshold voltage of the cell though program is performed using an ISPP program start voltage.

In other words, when the initial threshold voltage is low (a), variation in the initial threshold voltage is great, but as the ISPP program operation proceeds, the threshold voltage is changed with a constant slope. On the other hand, when the initial threshold voltage is high (b), variation in the initial threshold voltage is small, but as the ISPP program operation proceeds, the threshold voltage is changed with a constant slope.

The program operation of the MLC will be described in detail below. The program operation of the MLC may include three kinds of program operations, such as "11"→"10", "10"→"10", and "11"→"01". The state "11" corresponds to an erased state in which an initial threshold voltage is low, the state "10" corresponds to a state with an initial threshold voltage higher than that of the state "11", and the state "01" corresponds to a state after the ISPP program operation is performed sufficiently. In other words, the widths of the threshold voltage distributions will be compared below. The state "00" has the smallest threshold voltage distribution width, the state "01" has the second smallest threshold voltage distribution width, and the state "10" (corresponding to LSB program) has the widest threshold voltage distribution width.

Accordingly, to reduce the threshold voltage width of the state "10", it is necessary to sufficiently lower the ISPP program start voltage. This effect is shown in FIG. 3. FIG. 3 shows a case (a) when a general LSB program operation is performed and a case (b) when the LSB program operation is performed after five initial dummy ISPP pulses are applied. The case (b) shows that the threshold voltage distributions of the state "10" are equivalent to the threshold voltage distributions of the state "01".

The LSB program operation of the flash memory device according to an embodiment of the present invention will be described below by employing the above-mentioned description.

A method of programming a MLC having the state "11" as a MLC having the state "10" in which the threshold voltage distribution is the widest will be described as an example.

To perform a program, an initial pulse (n=1) is set at step 101 in FIG. 4. It is assumed that the ISPP voltage step according to the present invention is 0.2V.

A first dummy step pulse (n=1) is then applied to the MLC to be programmed having the state "11" at step 102.

A second dummy step pulse (the first dummy step pulse ++0.2V; n=2) having a voltage higher than that of the first dummy pulse (n=1) is applied to the MLC. Thereafter, a third dummy step pulse (the second dummy step pulse ++0.2V; n=3) having a voltage higher than that of the second dummy step pulse is applied to the MLC. In this manner, the first dummy step pulse to the fifth dummy step pulse (n=5) are sequentially applied at step 103.

If the dummy step pulses from the initial pulse (n=1) to the fifth pulse (n=5) are sequentially applied to the MLC as described above, variations in the threshold voltage of the MLC become gradually blunt as indicated by plot (a) in FIG. 3. As a result, as the pulse number is increased, a program voltage increment ratio and a threshold voltage increment ratio of the cell become close to 1. This means that the threshold voltage distributions of the MLC are narrowed.

At step 104, it is determined whether the first to fifth step pulses shown in FIG. 5 have been sequentially applied to the MLC. A program step pulse as shown in FIG. 5 is then applied to the MLC at step 105.

It is then determined whether the threshold voltage distribution of the MLC has changed to the state "10" by performing a verify operation on the MLC at step 106. If the threshold voltage distribution of the MLC has changed to the state "10", the program operation is finished at step 107. If the threshold voltage distribution of the MLC has not changed to the state "10", a program pulse (the step pulse 0.2V) having a voltage higher than that of the fifth program pulse is applied to the MLC in order to perform the program operation again.

The steps 105 to 108 are repeatedly carried out until the threshold voltage distribution of the MLC becomes the state for "10". That is, unlike the related art, in the present invention, after the dummy step pulses are applied to the MLC several times, the program pulse application operation and the verify operation are repeatedly performed.

According to the present invention, in a program operation of a flash memory device having a MLC, a dummy pulse not having a verify operation is applied to a MLC having the state "10" in which a threshold voltage distribution width is the widest before a program voltage is applied. Accordingly, the threshold voltage distribution width of the state "10" can be reduced. It is therefore possible to improve the retention characteristics of a flash cell and the reliability of devices.

While the invention has been described in connection with what is presently considered to be specific embodiments, it is to be understood that the invention is not limited to the disclosed embodiments, but, on the contrary, is intended to cover various modifications and equivalent arrangements included within the spirit and scope of the appended claims.

What is claimed is:

1. A program method of a flash memory device, the method comprising:
   repeatedly applying a dummy step pulse to the extent that an initial state of a cell is not changed while increasing a voltage of the dummy step pulse step by step;
   programming the cell by applying a program voltage to the cell; and
   performing a verify operation to verify a program state of the cell.

2. The program method of claim 1 further comprising:
   terminating the program operation if the cell has been determined to have been correctly programmed;
   raising the program voltage by a predetermined level if the cell has been determined not to have been programmed correctly; and
   applying the raised program voltage to the cell to program the cell.

3. The program method of claim 1, wherein the voltage of the dummy step pulse is lower than that of the program voltage.

4. The program method of claim 1, wherein the dummy step pulse is applied without a program verify operation.

5. The program method of claim 1, wherein the dummy step pulse is applied no more than five times.

6. The program method of claim 1, wherein the dummy step pulse and the program voltage are substantially the same potential.

7. The program method of claim 1, wherein the cell is Multi-Level Cell (MLC).

8. The program method of claim 2, wherein the predetermined level is about 0.2 volt.

9. A method for programming a non-volatile memory device, the method comprising:

applying a first dummy voltage to a cell;

applying a first program voltage to the cell to program the cell, the first program voltage being applied to the cell after the first dummy voltage has been applied to the cell; and verifying whether or not the cell has been programmed correctly by the first program voltage that has been applied to the cell.

10. The method of claim 9, further comprising:

applying a second dummy voltage to the cell after the first dummy voltage has been applied, the second dummy voltage being N volt higher than the first dummy voltage, wherein the second dummy voltage applied to the cell is of sufficiently low voltage, so that the second dummy voltage does not change an initial state of the cell.

11. The method of claim 10, further comprising:

applying a third dummy voltage to the MLC after the second dummy voltage has been applied, the third dummy voltage being N volt higher than the second dummy voltage.

12. The method of claim 11, wherein a predetermined number of dummy voltages are applied to the cell prior to applying the first program voltage to the cell, the method further comprising:

applying a second program voltage to the cell if the cell is determined not to have been programmed correctly by the first program voltage, the second program voltage being higher than the first program voltage by N volt, wherein the first and second program voltages are applied to the cell after all the dummy voltages have been applied to the cell.

13. The method of claim 12, wherein N volt is no more than 0.4 volt.

14. The method of claim 12, wherein N volt is no more than 0.3 volt.

15. The method of claim 12, wherein N volt is no more than 0.2 volt.

16. The method of claim 9, wherein the cell is Multi-Level Cell (MLC).

* * * * *